US006404476B1

(12) United States Patent
Mase

(10) Patent No.: US 6,404,476 B1
(45) Date of Patent: *Jun. 11, 2002

(54) DEVICE HAVING AN IMPROVED CONNECTIVE STRUCTURE BETWEEN TWO ELECTRODES

(75) Inventor: Akira Mase, Atsugi (JP)

(73) Assignee: Semiconductor Energy Laboratory Co., Ltd., Kanagawa-ken (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/962,448

(22) Filed: Oct. 31, 1997

Related U.S. Application Data

(62) Division of application No. 07/851,659, filed on Mar. 16, 1992, now Pat. No. 5,710,612, which is a division of application No. 07/575,442, filed on Aug. 30, 1990, now Pat. No. 5,130,833.

(30) Foreign Application Priority Data

Sep. 1, 1989 (JP) .............................................. 1-226664
Sep. 6, 1989 (JP) .............................................. 1-232308

(51) Int. Cl.$^7$ ............................................ G02F 1/1345
(52) U.S. Cl. ...................... 349/149; 349/155; 349/157; 174/882
(58) Field of Search ...................... 174/88 R; 252/514; 349/149, 155, 157, 123

(56) References Cited

U.S. PATENT DOCUMENTS

4,113,981 A * 9/1978 Fujita et al. .............. 174/88 R (List continued on next page.)

FOREIGN PATENT DOCUMENTS

| EP | 2 549 627 | 1/1985 | |
| EP | 0 242 025 | 10/1987 | |
| FR | 2549627 | 1/1985 | |
| JP | 50-57458 | 5/1975 | |
| JP | 54-12599 | 1/1979 | ............. G09F/9/00 |
| JP | 60-67984 | 4/1985 | |
| JP | 62-94379 | 12/1985 | |
| JP | 60-260393 | 12/1985 | |
| JP | 62-94379 | 6/1987 | ............. G09F/9/00 |
| JP | 63-175485 | 7/1988 | |
| JP | 63-175495 | 7/1988 | ................. 257/633 |
| JP | 63-241523 | 10/1988 | ............. G09F/9/00 |
| JP | 63-284591 | 11/1988 | |
| JP | 63-300224 | 12/1988 | ................. 359/88 |
| JP | 1-152489 | 6/1989 | |
| JP | 1-125485 | 8/1989 | |
| JP | 1-281487 | 11/1989 | ............. G09F/9/00 |

*Primary Examiner*—James A. Dudek
(74) *Attorney, Agent, or Firm*—Eric J. Robinson; Nixon Peabody LLP

(57) ABSTRACT

A liquid crystal device and a manufacturing method thereof are described. The device comprises a liquid crystal panel and an auxiliary panel formed with an IC circuit for supplying driving signals to the liquid crystal device. The auxiliary substrate is separately provided with the circuit and the function thereof is tested in advance of the assembling with the liquid crystal panel. By this procedure, the yield is substantially improved.

25 Claims, 4 Drawing Sheets

U.S. PATENT DOCUMENTS

| | | | |
|---|---|---|---|
| 4,131,909 A | 12/1978 | Matsuda et al. | 257/633 |
| 4,216,491 A | 8/1980 | Matsuda et al. | 257/633 |
| 4,526,818 A | 7/1985 | Hoshikawa et al. | 359/63 |
| 4,586,791 A * | 5/1986 | Isogai et al. | 349/123 |
| 4,588,456 A | 5/1986 | Dery et al. | 174/88 |
| 4,642,421 A | 2/1987 | Dery et al. | 174/88 |
| 4,654,965 A | 4/1987 | Uehara et al. | 359/88 |
| 4,655,551 A | 4/1987 | Washizuka et al. | 359/88 |
| 4,740,657 A * | 4/1988 | Tsukagoshi et al. | 174/88 R |
| 4,772,100 A | 9/1988 | Suenaga | 359/88 |
| 4,814,040 A | 3/1989 | Ozawa | 156/63 |
| 4,892,392 A * | 1/1990 | Broer | 349/123 |
| 4,896,946 A | 1/1990 | Suzuki et al. | 359/88 |
| 4,930,876 A | 6/1990 | Suzuki et al. | 359/88 |
| 4,959,178 A * | 9/1990 | Frentzel et al. | 252/514 |
| 4,999,460 A | 3/1991 | Sugiyama et al. | 174/94 |
| 5,001,302 A * | 3/1991 | Atsumi | 174/94 R |
| 5,130,833 A * | 7/1992 | Mase | 349/149 |
| 5,155,301 A * | 10/1992 | Mase | 174/88 R |
| 5,179,460 A * | 1/1993 | Hinata et al. | 349/149 |
| 5,287,208 A * | 2/1994 | Shimoto et al. | 349/123 |
| 5,710,612 A * | 1/1998 | Mase | 349/149 |

* cited by examiner

DEVICE HAVING AN IMPROVED CONNECTIVE STRUCTURE BETWEEN TWO ELECTRODES

This is a Divisional application of Ser. No. 07/851,659, filed Mar. 16, 1992, now U.S. Pat. No. 5,710,612; which itself is a Division of Ser. No. 07/575,442, filed Aug. 30, 1990 (now U.S. Pat. No. 5,130,833).

BACKGROUND OF THE INVENTION

1. Field of the Invention

The present invention relates to liquid crystal device and manufacturing method for the same.

2. Description of the Prior Art

Liquid crystal devices have been broadly used. Particularly, due to their light weights and small sizes, many compact electric appliances such as compact electric calculators, watches, lap-top word processors and pocket television systems are provided with liquid crystal displays.

The driving circuit of such a liquid crystal display has been formed in a separate printed board made of a glass epoxy substrate in which a semiconductor device such as a packaged IC is mounted. The electric connection is made through FPC (Flexible Print Circuit) between the printed board and inner electrodes formed in the insides surfaces of a pair of substrates in which a liquid crystal is disposed.

Recently, TAB (Tape Automated Bonding) has been employed to make electric connection. In accordance with this method, semiconductor chips provided with solder bumps on their contact pads are mounted on and electrically connected with Cu electrodes formed on a polyimide film by face-down bonding (ILB: Inner Lead Bonding), and then electrode strips formed on the substrates of a liquid crystal display are coupled respectively with counterpart electrode strips of the polyimide film (OLB: Outer Lead Bonding).

The IC chips can be mounted directly on the substrates of a liquid crystal display. In this case, an electric circuit pattern for supplying driving signals to electrode strips of the substrates defining pixels of the liquid crystal display and control signals to the chips has to be formed in advance. The IC chips are connected to the pattern by means of Au wiring or bumps attached to the contact pads of the chips.

There are some shortcomings, however, in the above conventional technique. In the case using a glass epoxy board, the advantage of light weights claimed by liquid crystal display is largely diminished because of the heavy board. Furthermore, the use of the intermediary FPC is undesirable. There are two sites of connection at both ends of the FPC and therefore the frequency of occurrence of connection error is doubled. The difference between the FPC and the glass substrates of a liquid crystal display in thermal expansion coefficient becomes a cause of stress at the connection. This problem is also the case at the connection made in accordance with the TAB method. In addition, polyimide tape is expensive. In the case of the direct mounting of IC chips, the yield of production is the product of the yield of liquid crystal panel and the yield of the driving circuit and therefore the decrease of the whole yield is substantial.

BRIEF SUMMARY OF THE INVENTION

It is an object of the present invention to provide a light weight liquid crystal device.

It is another object of the present invention to provide a method of manufacturing liquid crystal devices at a high yield.

Additional objects, advantages and novel features of the present invention will be set forth in the description which follows, and in part will become apparent to those skilled in the art upon examination of the following or may be learned by practice of the present invention. The object and advantages of the invention may be realized and attained by means of the instrumentalities and combinations particularly pointed out in the appended claims.

To achieve the foregoing and other object, and in accordance with the present invention, as embodied and broadly described herein, there is provided a third substrate beside a pair of substrates sandwiching a liquid crystal layer therebetween. The third substrate is provided with IC chips for producing driving signals to be supplied to electrode arrangement formed on the inside surfaces of the pair of substrates. In accordance with the present invention, no epoxy print board is used and therefore the peculiar advantage of liquid crystal devices, i.e. the light weight, is not diminished.

As a method for electrically connecting the third substrate and the pair of substrates, there are several examples such as a method making use of a UV light curable anisotropic conductive adhesive disposed between the third substrate and the respective substrates, a method making use of FPCs or a method making use of an anisotropic conductive rubber.

Furthermore, in accordance with the present invention, the liquid crystal panels and the circuit boards for producing driving signals are manufactured and tested separately and therefore inoperative boards can be eliminated in advance of assembling process of liquid crystal displays so that the yield is expected to substantially increase.

BRIEF DESCRIPTION OF THE DRAWINGS

The accompanying drawings, which are incorporated in and form a part of the invention and, together with the description, serve to explain the principles of the invention.

DETAILED DESCRIPTION OF THE PREFERRED EMBODIMENTS

Figure 1:
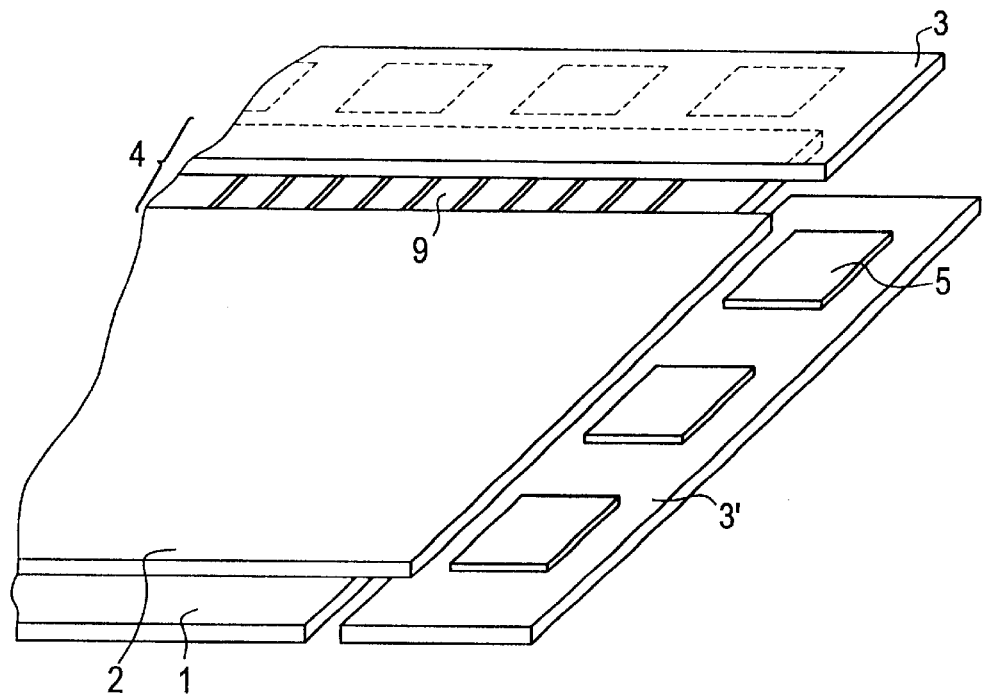
FIG. 1 is a perspective view showing a liquid crystal display in accordance with an embodiment of the present invention.
Figure 3:
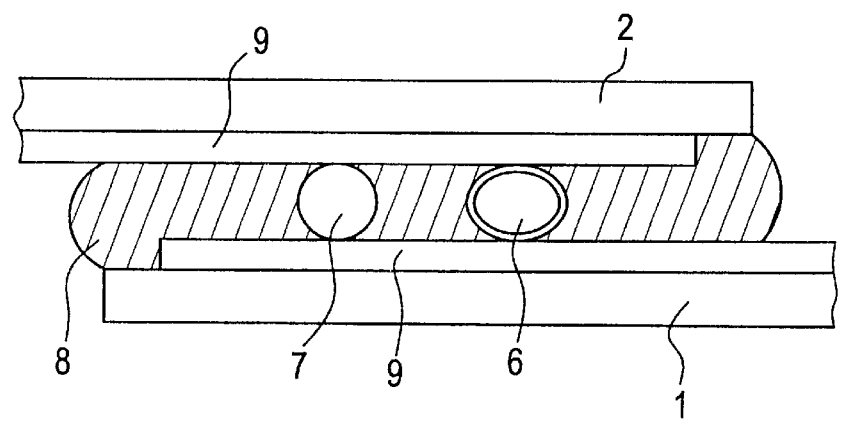
FIG. 3 is a partial cross sectional view showing electrical connection between substrates carrying electrode strips in accordance with the present invention.

Referring now to FIGS. 1, 2 and 3, a liquid crystal display in accordance with the present invention is illustrated. The liquid crystal display comprises a pair of glass substrates 1 and 2 between which a liquid crystal layer is disposed, and a pair of auxiliary substrates 3 carrying thereon a driving circuit for supplying driving signals to orthogonal electrode strips 9 arranged in the inside surfaces of the substrates 1 and 2 as shown in FIG. 1. The auxiliary substrates 3 and the substrates 1 and 2 are connected respectively at their edges in order to establish electrical coupling between corresponding electrodes.

Figure 2A:
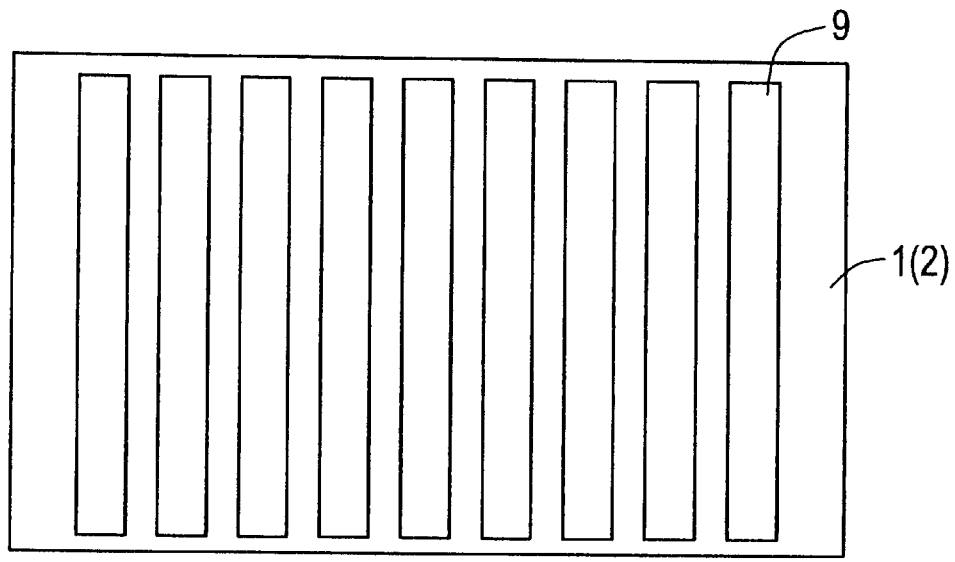
FIGS. 2(A) and 2(B) are plan views showing substrates formed with electrode strips for liquid crystal display.

Next, a method of manufacturing the liquid crystal display in accordance with a first embodiment is explained. First and second sodalime glass substrates of 1.1 mm thickness are coated with transparent conductive films such as ITO (Indium Tin Oxide) films by DC magnetron sputtering to a thickness of 1200 angstroms. The conductive films are patterned by means of laser pulses emitted from an excimer laser into a number of parallel electrode strips as shown in FIG. 2(A). The number of electrode strips of the first substrate is 640 while that of the second is 400 since the shape of the substrates is rectangular and the electrode strips have to be orthogonally arranged when the substrates are joined in order to define pixels therebetween at the intersections of the orthogonal strips. The output energy of the excimer laser beam is 250 mJ. The pulse width is 20 nanoseconds. The cross section of the beam is 15 $\mu$m×400 mm. The repetition frequency is 10 Hz.

Figure 2B:
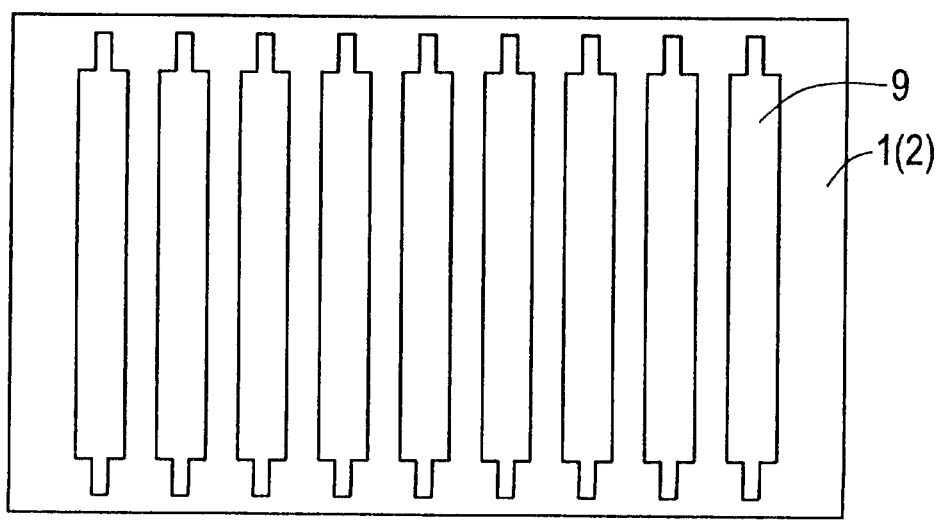

The laser scribing is carried out in the same manner again for the purpose of insuring the insulation between adjacent terminals of the electrodes. Namely, after the electrodes are formed, the laser scribing is carried out in order to reduce the width of the ends of the electrodes as shown in FIG 2(B) with a mask covering the center portions thereof. The cross section of the excimer laser beam in this case is 30 $\mu$m×400 mm. The other lasing conditions are same as those of the above. The surfaces of the substrates provided with the electrodes are then coated with polyamic acid by the offset printing. The polyamic acid is then cured in a clean oven at 350 ° C. for three hours to form polyimide thin films. The polyimide film on the first substrate is given rubbing treatment by means of a cotton cloth and $SiO_2$ fine particles of 8 $\mu$m diameter are dusted thereon as spacers. The second substrate is given an adhesive at its perimeter and joined to the first substrate. The inside space between the first and second substrates are filled with a liquid crystal material by a known vacuum injection. The opening, through which the liquid crystal material is injected, is then sealed off by an adhesive cured by ultraviolet rays. One side of each of the first and second substrates extends together with the electrode strips and is exposed beyond the other substrate in order to provide contacts for electrically connection with the driving circuits formed on the auxiliary substrates 3 as shown in FIG. 1.

The auxiliary substrates 3 are provided by depositing ITO films on 1.1 mm thick sodalime glass substrates of 50 mm width and 270 mm length. The ITO film is patterned by a known photolithography. The ITO pattern is then coated with Ni and thereafter with Au respectively by plating. The pattern includes contacts with which IC chips for producing driving signals are electrically connected. The connection of the chips and the contacts are made by applying Au bumps to contact pads of the chips, dripping a curable adhesive onto the rare surfaces of the chips and, after aligning the pads and the contacts of the substrate, exposing the adhesive to ultraviolet light under pressure of 95 g per bump at 150° C. for three minutes in order to harden the adhesive and fix the chips to the substrate. Then, the driving circuits as manufactured as above on the substrate are tested at the outer leads with which the electrodes of a liquid crystal display should be connected for supplying driving signals in order to eliminate substrates carrying inoperative circuits.

The electric connection between the first and second substrates 1 and 2 and the counterpart auxiliary substrates 3 respectively are done as follows. The extended inside surfaces of the first substrates 1 on which terminals of the respective electrodes are exposed are coated, by means of a dispenser, with an anisotropic conductive film. The adhesive film is made from a UV light curable adhesive 8 in which a number of resilient fine conductive particles 6 and hard particles 7 whose diameter is slightly smaller than that of the resilient particles are dispersed. The resilient particles are made from 7.5 $\mu$m thick polystyrene spheres plated with a 1000 angstroms thick Au film. The hard particles are made from 5 $\mu$m thick $SiO_2$ spheres. The weight proportion among the adhesive, the resilient particles and the hard particles is 107:14:1. Then, the first substrate 1 and the auxiliary substrates 3 are joined with the adhesive therebetween in order that the the terminals of the first substrate 1 and the corresponding contacts of the auxiliary substrate 3 are aligned to each other, and exposed to UV light for 3 minutes under pressure of about 2.4 kg/cm$^2$. The hard particles are included in order to prevent the conductive resilient particles from being destroyed under excess pressure. The second substrate 2 is electrically connected with the other auxiliary substrate 3 in the same manner. When displays as produced as above were subjected to a thermal shock test at −30° C. and at 70° C. respectively for an hour, all the sample displays were maintained operable.

Next, a method of manufacturing the liquid crystal display in accordance with a second embodiment is explained in conjunction with FIGS. 1, 2(A) and 3. First and second sodalime glass substrates of 1.1 mm thickness are coated with transparent conductive films such as ITO (Indium Tin Oxide) films by DC magnetron sputtering to a thickness of 1200 angstroms. The conductive films are patterned by means of laser pulses emitted from an excimer laser into a number of parallel electrode strips as shown in FIG. 2(A). The number of electrode strips of the first substrate is 640 while that of the second is 400 since the shape of the substrates is rectangular and the electrode strips have to be orthogonally arranges when the substrates are joined in order to define pixels therebetween at the intersections of the orthogonal strips. The output energy of the excimer laser beam is 250 mJ. The pulse width is 20 nanoseconds. The cross section of the beam is 15 $\mu$m×400 mm. The repetition frequency is 10 Hz.

In this case, the treatment of terminals of the electrode strips 9 is not carried out. A liquid crystal panel is assembled in the same manner as the above embodiment except that the first and second substrates are provided with the electrode strips as illustrated in FIG. 2(A) rather than FIG. 2(B). A pair of auxiliary substrates are provided also in the same manner as the above embodiment.

The electric connection between the first and second substrates 1 and 2 and the counterpart auxiliary substrates 3 respectively are done as follows. The extended inside surfaces of the first substrates 1 on which terminals of the respective electrodes are exposed are coated, by means of a dispenser, with an anisotropic conductive film. The adhesive film is made from a UV light curable adhesive 8 in which a number of resilient fine conductive particles 6 and hard particles 7 whose diameter is slightly smaller than that of the resilient particles are dispersed. The resilient particles are made from 2.5 $\mu$m thick polystyrene spheres plated with a 1000 angstroms thick Au film. The hard particles are made from 2 $\mu$m thick $SiO_2$ spheres. The weight proportion among the adhesive, the resilient particles and the hard particles is 98:13:3. Then, the first substrate 1 and the auxiliary substrates 3 are joined with the adhesive therebetween in order that the the terminals of the first substrate 1 and the corresponding contacts of the auxiliary substrate 3 are aligned to each other, and exposed to UV light for 3 minutes under pressure of about 2.4 kg/cm$^2$. The hard particles are included in order to prevent the conductive resilient particles from being destroyed under excess pressure. The second substrate 2 is electrically connected with the other auxiliary substrate 3 in the same manner. When displays as produced as above were subjected to a thermal shock test at −30 ° C. and at 70° C. respectively for an hour, all the sample displays were maintained operatable.

Next, a method of manufacturing the liquid crystal display in accordance with a third embodiment is explained in conjunction with FIGS. 1 and 2(A). First and second sodalime glass substrates of 1.1 mm thickness are coated with transparent conductive films such as ITO (Indium Tin Oxide) films by DC magnetron sputtering to a thickness of 1200 angstroms. The conductive films are patterned by a known photolithography into a number of parallel electrode strips as shown in FIG. 2(A). The number of electrode strips of the first substrate is 640 while that of the second is 400 since the shape of the substrates is rectangular and the electrode strips have to be orthogonally arranged when the substrates are joined in order to define pixels therebetween at the intersections of the orthogonal strips.

The surfaces of the substrates provided with the electrodes are then coated with polyamic acid by the offset printing. The polyamic acid is then cured in a clean oven at 350° C. for three hours to form polyimide thin films. The polyimide film on the first substrate is given rubbing treatment by means of a cotton cloth and $SiO_2$ fine particles of 8 μm diameter are dusted thereon as spacers. The second substrate is given an adhesive at its perimeter and joined to the first substrate. The inside space between the first and second substrates are filled with a liquid crystal material by a known vacuum injection. The opening, through which the liquid crystal material is injected, is then sealed off by an adhesive cured by ultraviolet rays. One side of each of the first and second substrates extends together with the electrode strips and is exposed beyond the other substrate in order to provide contacts for electrically connection with the driving circuits formed on the auxiliary substrates 3 as shown in FIG. 1. Then, a pair of auxiliary substrates are provided, tested and coupled with the liquid crystal panel in the same manner as the above embodiment.

Figure 4:
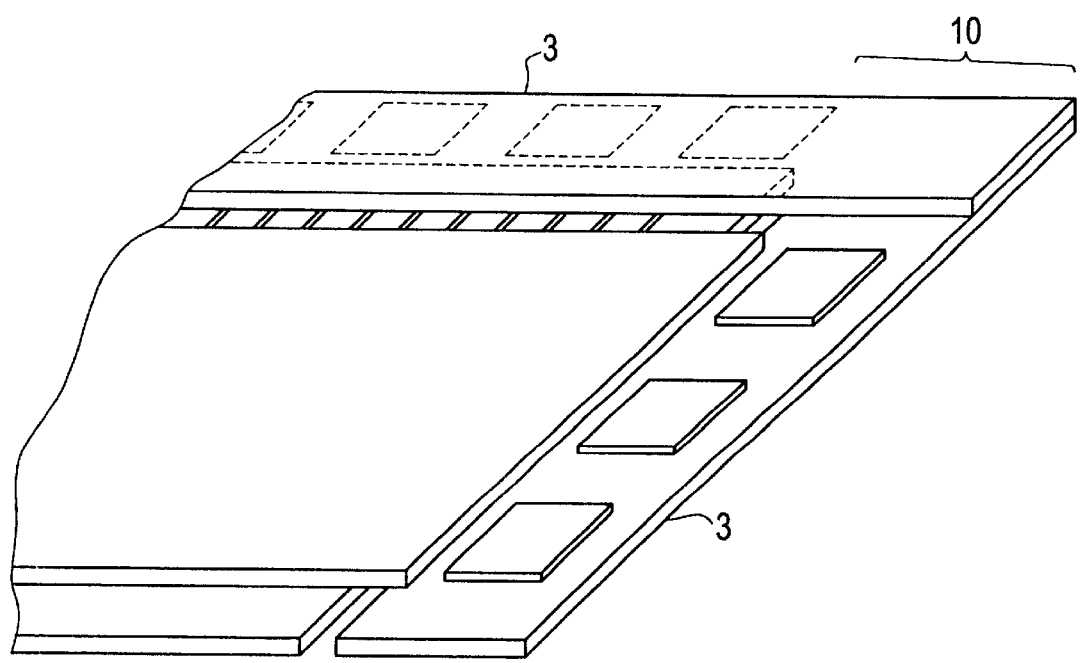
FIG. 4 is a perspective view showing a liquid crystal display in accordance with a modification of the embodiment of the present invention shown in FIG. 1.

FIG. 4 illustrates a modification of the embodiment illustrated in FIG. 1. The liquid crystal panel is same as that of the first embodiment. One end of each auxiliary substrate 3 is formed to extend in order to join with the other substrate 3. The extended ends of the substrates are fixed to each other by means of a UV light curable adhesive as shown in FIG. 4. Since the distance between the joined ends of the substrates 3 equals the distance between the substrate 1 and 2 which are adhered in the same manner, this procedure can be naturally done without any dimmension disagreement.

Figure 5:
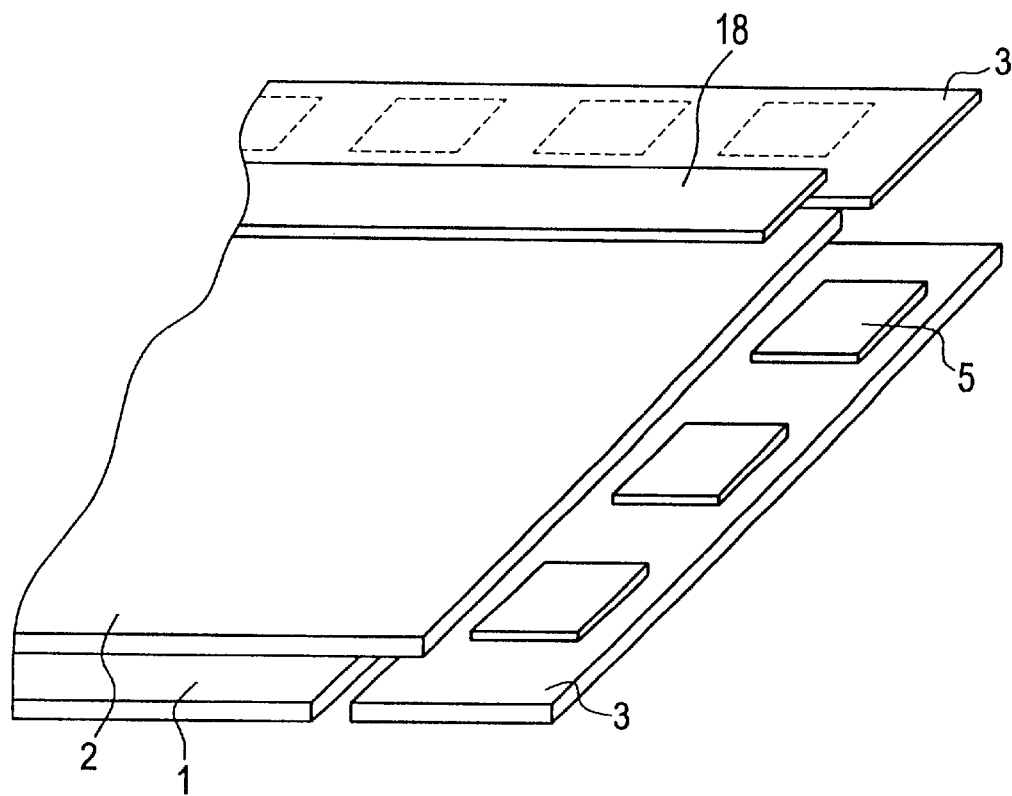
FIG. 5 is a perspective view showing a liquid crystal display in accordance with another modification of the embodiment of the present invention.

FIG. 5 illustrates another modification of the embodiment illustrated in FIG. 1. The liquid crystal panel is same as that of the first embodiment. A reinforcement plate 18 is attached to the auxiliary substrate 3 and the substrate 2 astride the gap therebetween. Since the substrates 3 and 2 have their upper surfaces flush with each other, this procedure can be naturally done without any dimmension disagreement.

Figure 6:
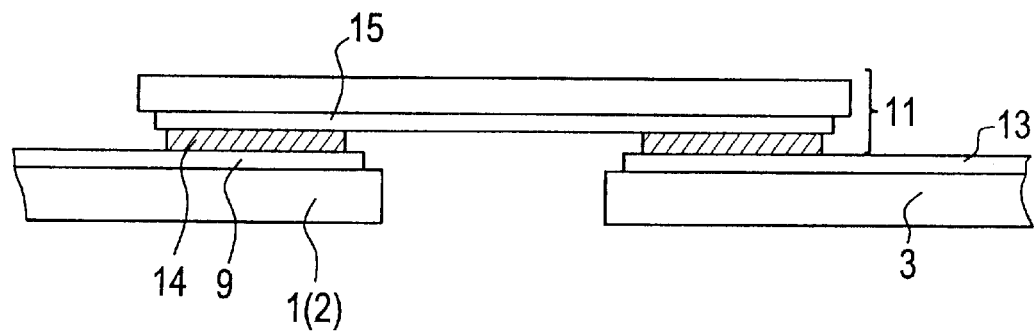
FIG. 6 is a perspective view showing a liquid crystal display in accordance with a further modification of the embodiment of the present invention.

FIG. 6 illustrates a further modification of the embodiment illustrated in FIG. 1. The liquid crystal panel and the auxiliary substrates are same as that of the first embodiment. The connection therebetween is done through FPCs. Namely, the substrate 1 or 2 is coupled with an FPC 11 by means of an anisotropic conductive film 14. At the other end of the FPC 11, the auxiliary substrate 3 is coupled with the FPC also by means of the anisotropic conductive film 14. The conductive film 14 comprises a thermally curable adhesive which adheres the FPC 11 to the substrate by thermal treatment at 200 ° C. for 8 seconds under pressure of 30 $kg/cm^2$. By This procedure, the electrodes of the substrates 1 and 2 are coupled with the corresponding electrodes 13 of the auxiliary substrates 3 respectively through Cu conductive strips 15 formed on the FPC 11.

The foregoing description of preferred embodiments has been presented for purposes of illustration and description. It is not intended to be exhaustive or to limit the invention to the precise form described, and obviously many modifications and variations are possible in light of the above teaching. The embodiment was chosen in order to explain most clearly the principles of the invention and its practical application thereby to enable others in the art to utilize most effectively the invention in various embodiments and with various modifications as are suited to the particular use contemplated. Although in the above description a pair of substrates sandwiching a liquid crystal layer are provided with electrode strips and connected with a pair or auxiliary substrates on which IC chips are mounted respectively to supply driving signals, there are devices which require driving signals only at one of the pair of the substrates. In this case, the auxiliary substrates are needed only one for one liquid crystal panel.

What is claimed is:

1. A liquid crystal device comprising:
a first substrate;
at least one first electrode formed over said first substrate;
a second substrate opposed to said first substrate with a liquid crystal material therebetween;
a circuit for supplying driving signals to said at least one first electrode, said circuit having at least one second electrode; and
an electrically conductive adhesive, through which said first and second electrodes are connected to each other, wherein said adhesive comprises an adhesive resin, resilient conductive particles and hard particles, and a weight proportion of said resilient conductive particles is larger than that of said hard particles.

2. A liquid crystal device according to claim 1 wherein said resilient conductive particles comprises spheres coated with a metal.

3. A liquid crystal device according to claim 2 wherein said spheres comprise polystyrene.

4. A liquid crystal device according to claim 1 wherein said hard particles comprise silicon oxide.

5. A liquid crystal device according to claim 1 wherein said resilient conductive particles have a larger diameter than said hard particles.

6. An electronic device comprising:
a first substrate having at least one first electrode formed over said first substrate;
a circuit for supplying driving signals to said at least one first electrode, said circuit having at least one second electrode; and,
an electrically conductive adhesive, through which said first and second electrodes are connected to each other, wherein said conductive adhesive extends lengthwise beyond each end of the first and second electrodes, and wherein said conductive adhesive comprises resin, and resilient conductive particles, and said first electrode comprises a transparent conductive oxide.

7. An electronic device according to claim 6 wherein said resilient conductive particles comprise resilient particles coated with a film comprising Au.

8. An electronic device according to claim 6 wherein said particles comprise polystyrene.

9. An electronic device according to claim 6 wherein said conductive adhesive further comprises hard particles.

10. An electronic device according to claim 9 wherein said resilient conductive particles have a larger diameter than said hard particles.

11. An electronic device according to claim 6 wherein said device is a liquid crystal device.

12. A liquid crystal device comprising:

a substrate;

a plurality of first electrodes comprising a transparent conductive oxide formed over said substrate;

a member carrying second electrodes thereon, wherein said second electrodes are electrically connected to an integrated circuit chip; and an electrically conductive adhesive between said first electrodes and said second electrodes, wherein said electrically conductive adhesive comprises an adhesive resin, resilient conductive particles and hard particles and said resilient conductive particles are contained in said adhesive resin at a higher weight proportion than said hard particles.

13. A liquid crystal device according to claim 12 wherein said resilient conductive particles comprises spheres coated with a metal.

14. A liquid crystal device according to claim 13 wherein said spheres comprise polystyrene.

15. A liquid crystal device according to claim 12 wherein said hard particles comprise silicon oxide.

16. A liquid crystal device according to claim 12 wherein said resilient conductive particles have a larger diameter than said hard particles.

17. An electric device comprising:

a plurality of first electrodes;

a plurality of second electrodes:

an adhesive resin provided between said first and second electrodes, said adhesive resin containing resilient conductive particles and hard particles wherein at least one of said first electrodes is electrically connected to at least one of said second electrodes through at least one of said resilient conductive particles, wherein said resilient conductive particles are contained in the adhesive resin at a higher weight proportion than said hard particles.

18. An electric device according to claim 17 wherein said resilient conductive particles have a larger diameter than said hard particles.

19. An electric device according to claim 17 wherein said conductive particles comprises spheres coated with a metal.

20. An electric device according to claim 19 wherein said spheres comprise polystyrene.

21. An electric device according to claim 17 wherein said hard particles comprise silicon oxide.

22. An electronic device comprising:

a substrate;

at least one first electrode comprising transparent conductive oxide formed over said substrate;

a second electrode electrically connected to said first electrode with a resin interposed therebetween wherein said resin includes resilient conductive particles, wherein each of said conductive particles comprises a resilient particle coated with a metal film and each end of said first electrode and said second electrode is completely covered by said resin in a lengthwise direction.

23. An electronic device according to claim 22 wherein said metal film comprises Au.

24. An electronic device according to claim 22 wherein said resilient particle comprises polystyrene.

25. An electronic device according to claim 22 wherein said device is a liquid crystal device.

* * * * *